US008461027B2

(12) United States Patent
Alet et al.

(10) Patent No.: US 8,461,027 B2
(45) Date of Patent: Jun. 11, 2013

(54) METHOD FOR PRODUCING NANOSTRUCTURES ON METAL OXIDE SUBSTRATE, METHOD FOR DEPOSITING THIN FILM ON SAME, AND THIN FILM DEVICE

(75) Inventors: Pierre-Jean Alet, Oxford (GB); Pere Roca I Cabaroccas, Villebon sur Yvette (FR)

(73) Assignees: Ecole Polytechnique, Palaiseau (FR); Centre National de la Recherche Scientifique, Paris (FR); Commissariat a l'Energie Atomique—CEA, Paris (FR)

( * ) Notice: Subject to any disclaimer, the term of this patent is extended or adjusted under 35 U.S.C. 154(b) by 299 days.

(21) Appl. No.: 12/933,442

(22) PCT Filed: Mar. 19, 2009

(86) PCT No.: PCT/FR2009/050470
§ 371 (c)(1),
(2), (4) Date: Sep. 20, 2010

(87) PCT Pub. No.: WO2009/122113
PCT Pub. Date: Oct. 8, 2009

(65) Prior Publication Data
US 2011/0042642 A1 Feb. 24, 2011

(30) Foreign Application Priority Data
Mar. 20, 2008 (FR) ...................................... 08 51817

(51) Int. Cl.
H01L 21/20 (2006.01)
(52) U.S. Cl.
USPC ..................................... 438/478; 257/E21.09
(58) Field of Classification Search
None
See application file for complete search history.

(56) References Cited

PUBLICATIONS

Alet et al., "In situ generation of indium catalysts to grow crystalline silicon nanowires at low temperature on ITO," Oct. 7, 2008, Journal of Materials Chemistry, vol. 18, p. 5187-5189.*
Graham Umet al: "Nanoweb Formation: 2D Self-Assembly.of Semiconductor Gallium Oxide Nanowires/Nanotubes" Advanced Functional Materials, Jul. 1, 2003, pp. 576-581, vol. 13, No. 7, Wiley VCH, Wienheim, DE, XPOO1164642.
Wang Y H et al: "Macroscopic field emission properties of aligned carbon nanotubes array and randomly oriented carbon nanotubes layer", Thin Solid Films, Feb. 22, 2002, pp. 243-247, vol. 405, No. 1-2, Elsevier-Sequoia S.A. Lausanne, CH, XP004342272.
Sunkara MK et al: "Bulk synthesis of silicon nanowires using a low-temperature vapor-liquid-solid method", Applied Physics Letters, AIP, American Institute of Physics, Sep. 3, 2001, pp. 1546-1548, vol. 79, No. 10, Melville, NY, XP012028827.
International Search Report, Dated Sep. 29, 2009, in PCT/FR2009/050470.

\* cited by examiner

*Primary Examiner* — Michael Lebentritt
*Assistant Examiner* — Kevin Quinto
(74) *Attorney, Agent, or Firm* — Young & Thompson

(57) ABSTRACT

A method for producing nanostructures on a metal oxide substrate includes the following steps: a) forming metal aggregates on the metal oxide substrate; and b) vapor phase growing nanostructures on the metal oxide substrate covered with metal aggregates, the substrate being heated in the presence of one or more precursor gases, and the vapor phase growth of nanostructures being catalyzed by the metal aggregates. The metal aggregate formation stage a) includes an operation for reducing the surface of the metal oxide substrate by reductive plasma treatment, causing droplets of metal aggregates to form on the substrate, the metal aggregate formation stage a) and the nanostructure growth stage b) being carried out in series in a single shared plasma reactor chamber, the nanostructure growth being directly carried out on the droplets of metal aggregates.

14 Claims, 4 Drawing Sheets

METHOD FOR PRODUCING NANOSTRUCTURES ON METAL OXIDE SUBSTRATE, METHOD FOR DEPOSITING THIN FILM ON SAME, AND THIN FILM DEVICE

FIELD OF THE INVENTION

The present invention relates to a process of producing nanostructures on a metal oxide substrate, a process of growing thin-film layers on such a substrate, and a thin-film device.

BACKGROUND OF THE INVENTION

The quasi-one-dimensional nanostructures, such as carbon nanotubes or semiconductor nanowires, are used in particular in the field of electronics (for example, thin-film transistors), in the field of optoelectronics (for example, solar cells, electroluminescent diodes), and as sensors because of their original properties (optical, electronic, thermal, mechanical) and their large specific surface area.

These nanostructures are obtained by being grown or deposited on a substrate that, in the field of optoelectronics, is preferentially both transparent and conductor of electricity. Such a substrate may be obtained by applying a thin-film layer of metal oxide as, for example, tin oxide ($SnO_2$) or tin-doped indium oxide (ITO, "indium tin oxide"), on a substrate of glass, polymer material, or other material. Hereinafter, such a substrate will be referred to as "metal oxide substrate".

Most of the nanostructures for which the direct growth on such metal oxide substrates is mentioned in the prior art are formed of metal oxides.

As for the nanostructures made from other semiconductors (silicon, germanium, gallium arsenide) or carbon, in most cases, they grow on single-crystalline silicon substrates, and are optionally transferred afterwards to another substrate.

The prior art processes of producing nanostructures conventionally comprise a first step of forming metal aggregates on the substrate, which serve to catalyze the nanostructures growth.

Several methods are known for positioning catalyst particles (or metal aggregates), such as the lithography method, the use of porous membranes, the deposition of metal colloids, as well as the evaporation and annealing of a thin-film metal layer.

Most of such methods for producing nanostructures on a substrate require heavy equipments, and can not be applied to large surfaces. They can neither be carried out in situ, except for the method of evaporating the metal layer, which, on the other hand, requires a complex installation.

Once the metal aggregates or catalysts are formed on the substrate, the later is transferred to a reactor in order to carry out a second step, which is the step of growing the nanostructures. Such transfer causes pollution or oxidation of the catalysts in contact with air, as well as loss of time (operations of loading/unloading, pumping, etc. . . . ).

During this second step, the nanostructure growth is carried out in vapour phase according to the vapour-liquid-solid (VLS) mechanism, known from: Wagner, R. S. & Ellis, W. C. "Vapor-liquid-solid mechanism of single crystal growth", *Applied Physics Letters*, 1964, 4, 89-90, or the vapour-solid-solid (VSS) mechanism, known from: Arbiol, J.; Kalache, B.; Roca i Cabarrocas, P.; Ramon Morante, J. & Fontcuberta i Morral, A., "Influence of Cu as a catalyst on the properties of silicon nanowires synthesized by the vapour-solid-solid mechanism", *Nanotechnology*, 2007, 18, 305606. The nanostructure growth is generally carried out from gaseous precursors by the method of chemical vapour deposition (CVD). The nanostructure growth is catalyzed by the metal aggregates.

Most of the known processes use single-crystalline substrates (generally silicon), so as to obtain an epitaxial growth.

A growth process by the method of CVD deposition on metal oxides for carbon nanotubes is also known from the prior art (Miller, A. J.; Hatton, R. A.; Chen, G. Y. & Silva, S. R. P., "Carbon nanotubes grown on In2O3: Sn glass as large area electrodes for organic photovoltaics", *Applied Physics Letters*, AIP, 2007, 90, 023105).

As for the semiconductor nanowires, the most known catalyst for the growth of such nanowires is gold, as disclosed in the document FR 2,873,492, with which the temperature is generally higher than 500° C. The use of gold as a catalyst causes electronic defaults in silicon.

Other metals, each having drawbacks, have also been tested, for example copper, with which the temperature window for the growth of nanowires is comprised between 600 and 650° C., aluminium, which oxides very rapidly and which thus requires an ultra-vacuum transfer of the samples, and nickel, with which the growth of carbon nanotubes is possible from 600° C., but is very slow under 700° C.

There is no known method that permits to grow nanostructures of a chemical element such as silicon directly on a metal oxide substrate.

SUMMARY OF THE INVENTION

Accordingly, one of the objects of the present invention is to propose a process of producing nanostructures on a metal oxide substrate, which permits to grow such nanostructures directly on the metal oxide substrate, without using an additional catalyst.

To that end, the present invention relates to a process of producing nanostructures on a metal oxide substrate, comprising the steps:

a) forming metal aggregates on said metal oxide substrate, b) vapour-phase growing nanostructures on the metal oxide substrate covered with metal aggregates, said substrate being heated in the presence of one or more precursor gases, and the vapour-phase growth of nanostructures being catalyzed by the metal aggregates.

According to the invention:

the step a) of forming metal aggregates comprises an operation of reducing the surface of the metal oxide substrate by means of a reducing plasma treatment, causing the formation of metal aggregate droplets on the surface of said metal oxide substrate, said steps of a) forming metal aggregates and b) growing nanostructures are carried out in series in a single and same plasma reactor chamber, the nanostructure growth being made directly on the metal aggregate droplets.

This process, according to the invention, permits to eliminate a step in the growing of nanostructure on a substrate, i.e. the step of depositing and positioning aggregates of a metal catalyst on a metal oxide substrate. The metal aggregates are obtained directly from the metal oxide of the substrate. This has the advantage to avoid any pollution and oxidation of the aggregates by air during the substrate transfer from the device in which the aggregates are positioned to the reactor in which the nanostructures grow.

Consequently, the complete growth process is shorter, better controlled (absence of pollution) and requires reduced equipment (for example, the use of an evaporator is avoided).

Moreover, with this process, it is possible to obtain on a metal oxide substrate nanostructures of a nature different from that of the metal oxide substrate.

The elements constituting the nanostructures come from the precursor gas(es).

In various possible embodiments, the present invention also relates to the following characteristics, which may be considered either alone or in any technically possible combination and which each provide specific advantages:

- the metal oxide substrate is composed of the oxide of a metal having a melting point lower than or equal to 300° C.,
- during the steps of a) forming metal aggregates and b) growing nanostructures, the metal oxide substrate is heated to a temperature higher than or equal to the melting point of the metal composing the metal oxide of the substrate,
- the metal oxide is chosen, for example, from $SnO_2$, ZnO, ITO or $In_2O_3$,
- the metal oxide substrate being formed of a substrate covered with a metal oxide layer, said metal oxide layer is discontinuous and comprises metal oxide patterns,
- the nanostructures are chosen from Si, Ge, SiGe, SiC, C or SiN,
- the plasma reactor being a plasma-enhanced chemical vapour deposition (PECVD) reactor, the precursor gas, used in the step b) of vapour phase growing the nanostructures, is diluted in a dilution gas, said dilution gas favouring the growth of fully crystalline nanostructures on the metal aggregates, and limiting by etching the deposition of amorphous elements outside the metal aggregates,
- the dilution gas is dihydrogen ($H_2$),
- the reducing plasma is hydrogen plasma, wherein the process of hydrogen plasma treatment comprises the steps of:
  - injecting gaseous hydrogen ($H_2$) in the chamber of the plasma reactor, and
  - generating a plasma in the chamber of the plasma reactor during a time duration t, the diameter of the metal aggregate droplets depending, among other things, on said time duration t,
- the plasma reactor is a radiofrequency plasma-enhanced chemical vapour deposition (PECVD-RF) reactor, wherein, during the operation of hydrogen plasma treatment:
  - the pressure of hydrogen in the chamber of the plasma reactor is comprised between 180 mTorr and 1000 mTorr, preferably equal to 1000 mTorr, corresponding to a time duration t of plasma generation in the chamber of the plasma reactor of about 3 min,
  - the radiofrequency power density used to generate the plasma is comprised between 10 and 1000 $mW/cm^2$.

The present invention also relates to a process of depositing thin-film layers on a metal oxide substrate.

According to the invention, this process comprises:

- the steps a) and b) of the above-defined process of producing nanostructures on a metal oxide substrate, wherein a precursor gas is injected into the plasma reactor, so as to obtain a metal oxide substrate covered with crystalline element nanowires,
- a step of depositing an amorphous or polycrystalline element thin-film layer, during which the temperature of the metal oxide substrate is controlled around 200° C., wherein the same precursor gas is injected into said plasma reactor, so as to permit the covering of the crystalline element nanowires with an amorphous or polycrystalline element thin-film layer.

In various possible embodiments, the present invention also relates to the following characteristic, which may be considered either alone or in combination:

- the process of depositing thin-film layers on a metal oxide substrate comprises, after the step of depositing the amorphous or polycrystalline element thin-film layer, a step of depositing an amorphous or polycrystalline element thin-film layer or a semiconductor organic thin-film layer.

The present invention also relates to a thin-film device.

According to the invention, this device is obtained by the above-defined process, and comprises:

- a metal oxide substrate covered with crystalline element nanowires, and
- an amorphous or polycrystalline element thin-film layer covering said crystalline element nanowires.

In various possible embodiments, the present invention also relates to the following characteristic, which may be considered either alone or in combination:

- the thin-film device comprises an amorphous or polycrystalline element thin-film layer, or a semiconductor organic thin-film layer, covering said amorphous or polycrystalline element thin-film layer.

The process, according to the invention, permits, by the use of plasmas (acting on the precursor gas molecule dissociation) and metals, coming from the metal oxides, of low melting point, to substantially reduce the temperature during the treatment (less than 300° C., compared to more that 450° C. with gold as a catalyst in the prior art processes). This enlarges the range of potentially usable substrates (the metal oxides may be deposited as thin-film layers on many types of support), and induces reduced fabrication costs.

The reduction of temperature also permits to lower the power consumption during the implementation of the process of the invention, which is a more economical process than those of the prior art.

The nanostructures obtained with this process are also of best quality. This process permits to have a perfect cohesivity between the nanostructures and the metal oxide substrate (because they grow directly from the latter). The metal oxide substrate has itself electric and optical properties that can be used in thin-film devices.

As the plasma treatments can be applied to large samples (there exists reactors that permit to deposit amorphous silicon on substrates of 5 $m^2$), this process permits to rapidly obtain mats of nanostructures on large surface areas.

BRIEF DESCRIPTION OF THE DRAWINGS

The invention will be described in more detail with reference to the appended drawings, in which.

DETAILED DESCRIPTION OF THE INVENTION

Figure 1:
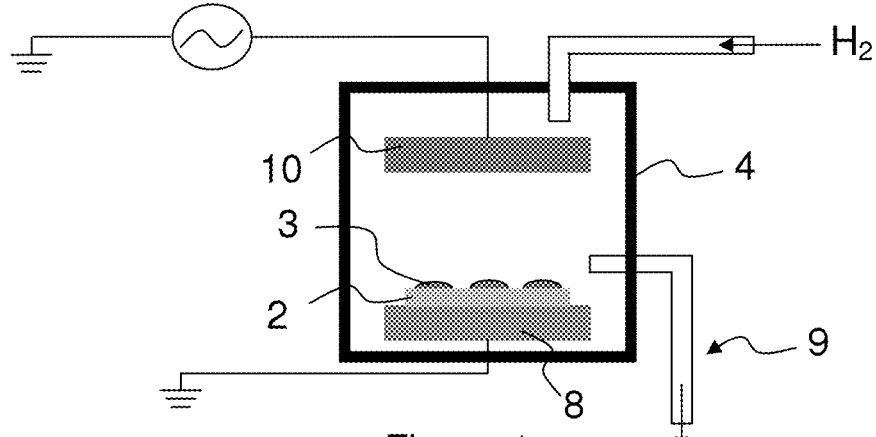
FIG. 1 illustrates a plasma reactor in which the step of forming metal aggregates on a metal oxide substrate is carried out, according to an embodiment of the invention.

FIG. 1 illustrates a plasma reactor in which the first step of forming metal aggregates on a metal oxide substrate is carried out, according to an embodiment of the invention.

In this example, this plasma reactor is a radiofrequency plasma-enhanced chemical vapour deposition (PECVD-RF) reactor. It is also possible to use other types of plasma reactors (for example, VHF, microwave . . . ) and other operating conditions.

The metal oxide substrate 2 is composed of a glass or polymer substrate or other, covered with a thin-film metal oxide layer.

The deposition of the metal oxide layer may be obtained by different techniques of deposition, such as pyrolysis, sputtering, chemical vapour deposition (CVD), etc. . . . .

The metal oxide layer may be optically transparent or not, and have optical and conductive properties.

After a conventional cleaning of the metal oxide substrate 2 (solvent baths), the latter is introduced into the chamber of the plasma reactor 4. It is placed on a substrate carrier 8.

The chamber of the plasma reactor 4 is then pumped under secondary vacuum (typically $5 \times 10^{-6}$ mbar). The plasma reactor comprises a pumping line 9 connected to a pump (not shown).

According to the invention, the step a) of forming metal aggregates comprises an operation of reducing the surface of the metal oxide substrate by means of a reducing plasma treatment, causing the formation of metal aggregate droplets 3 on the surface of the metal oxide substrate 2. As used herein "reducing plasma" means a plasma comprising a reducing element such as, for example, dihydrogen ($H_2$) or ammoniac ($NH_3$).

The reducing plasma treatment causes a surface reduction of the metal oxide substrate 2. The metal oxide substrate 2 may be fully reduced or not. The full reduction of the oxide layer is always possible; the choice depends on the wish to maintain or not the function of the metal oxide layer.

The metal oxide substrate 2 is composed of the oxide of a metal having a melting or eutectic point lower than or equal to 300° C., such as tin dioxide ($SnO_2$), tin-doped indium oxide (ITO, "indium tin oxide"), or indium trioxide ($In_2O_3$). The metal oxide may be doped or not. The use of such a substrate permits to substantially reduce the temperature of the gas and the substrate during the treatment.

The metal oxide substrate 2 may also be composed of the oxide of a metal having a melting or eutectic point lower than or equal to 300° C.

Figure 2:
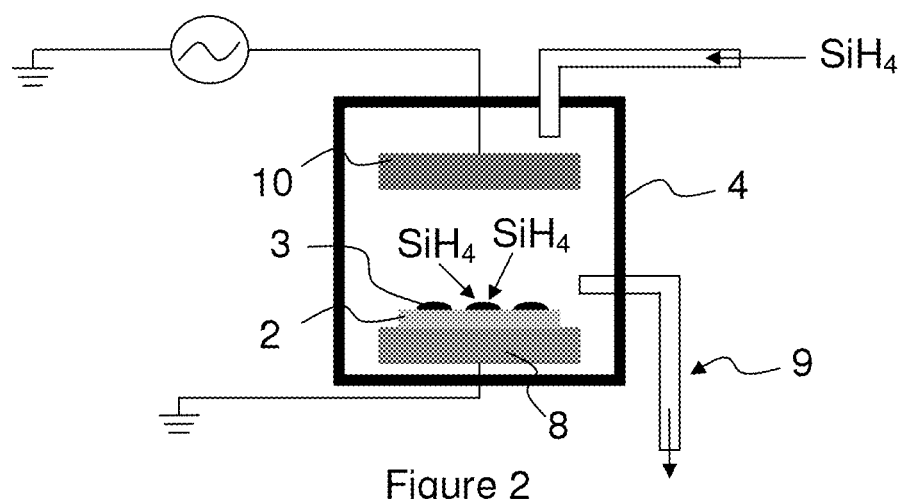
FIG. 2 illustrates the same plasma reactor when the metal oxide substrate is heated in the presence of a precursor gas (for example, of silane), according to the same embodiment of the invention.
Figure 3:
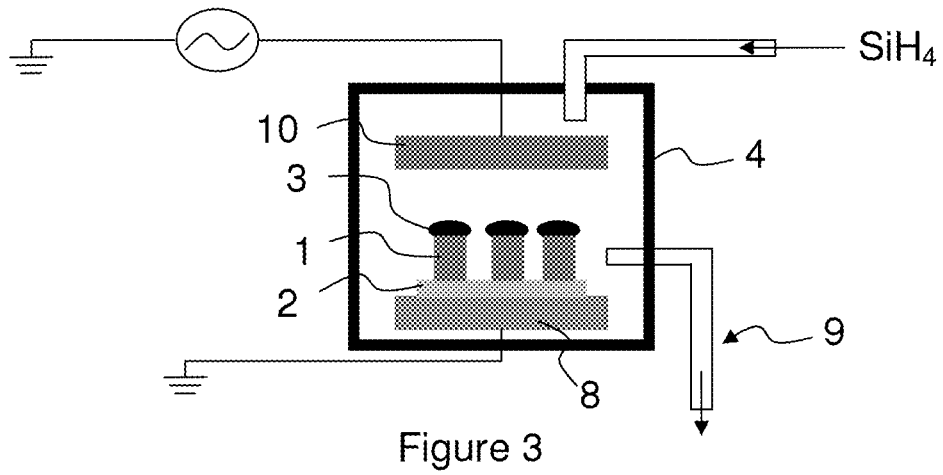
FIG. 3 illustrates the same plasma reactor when the vapour phase growth of the nanostructures is catalyzed by the metal aggregates, according to the same embodiment of the invention.

The example of FIGS. 1 to 3 is given for a process of producing silicon nanowires on an ITO-based metal oxide substrate 2.

During the steps of a) forming metal aggregates and b) growing nanostructures, the metal oxide substrate 2 is heated to a temperature higher than or equal to the melting point of the metal composing the metal oxide of the substrate.

The plasma reactor comprises a radiofrequency electrode 10, which is heated to a typical temperature of 200° C. The temperature of the gas is thus lower than 300° C.

Gaseous hydrogen ($H_2$) is introduced into the chamber of the plasma reactor 4, at a flow rate of about 100 sccm ("standard cubic centimetres per minute"). The pumping speed is adjusted so as to maintain the pressure inside the chamber of the plasma reactor 4 to a fixed value that is comprised between 180 mTorr and 1000 mTorr.

Through the application of a variable potential to the radiofrequency electrode 10, plasma is generated in the chamber of the plasma reactor 4, with an injected power of about 5 W, and maintained during a variable time duration t, which is a function of the pressure inside the chamber of the plasma reactor 4. The frequency of the radiofrequency plasma is 13.56 MHz. The injected power depends on the reactor size. The radiofrequency power density used to generate the plasma is comprised between 10 and 1000 mW/cm$^2$.

For example, a pressure of hydrogen of 1000 mTorr in the chamber of the plasma reactor 4 corresponds to a recommended time of reducing plasma treatment of 3 min. The optimal treatment time duration depends on the oxide reactivity toward hydrogen. It is shorter with ITO than with $SnO_2$.

As a result of the gaseous hydrogen ($H_2$) dissociation, $H_+$ ions and hydrogen atoms are formed, and accelerated to the metal oxide substrate 2, inducing a chemical reduction at the surface of the metal oxide substrate 2.

Through the reduction of at least part of the metal oxides present on the surface of the metal oxide substrate 2, metal aggregate droplets 3 are formed on the surface of the metal oxide substrate 2.

By varying the treatment time or conditions, it is possible to modify the quantity of reduced metal, and thus the droplet size and density. The diameter of the metal aggregate droplets 3, which may be of the order of one nanometre up to several nanometres, depends on the time duration t during which the plasma is generated. Other parameters, such as power, temperature, pressure, metal oxide reactivity toward hydrogen, influence the droplet size and density.

The reducing plasma treatment modifies very little the optical and electric properties of the metal oxide substrate 2 in the case of a partial reduction.

Figure 5:
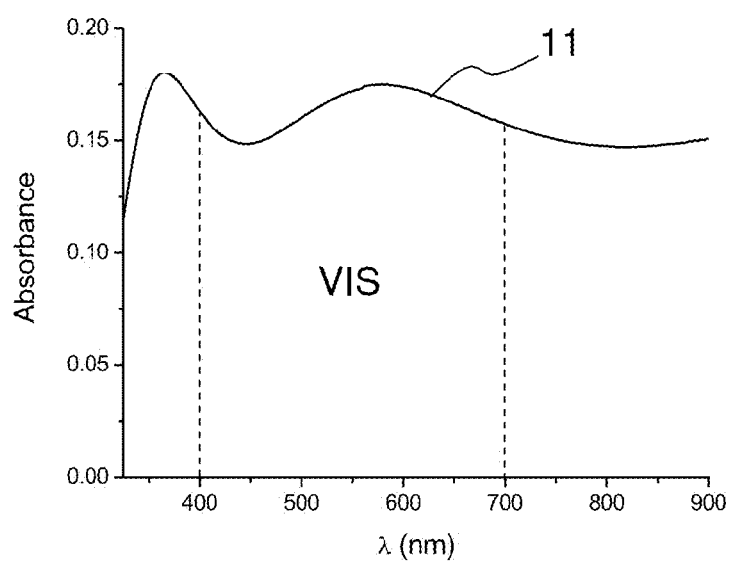
FIG. 5 illustrates an absorption spectrum of an ITO substrate after a hydrogen plasma treatment.

FIG. 5 illustrates the absorption spectrum 11 of the ITO on a glass substrate after 5 min of hydrogen plasma treatment at a pressure of 180 mTorr.

The absorption spectrum 11 shows that, after the hydrogen plasma treatment, the ITO substrate still remains widely transparent in the visible domain (wavelengths comprised between about 400 nm and 700 nm). The absorbance level of the ITO substrate is comprised between about 0.15 and 0.18.

The process of producing nanostructures 1 on the metal oxide substrate 2 also comprises a step b) of vapour phase growing nanostructures 1 on the metal oxide substrate 2 carrying the metal droplets, as shown in FIGS. 2 and 3.

The metal oxide substrate 2 is heated in the presence of one or several precursor gases, and the vapour phase growth of nanostructures 1 is catalyzed by the metal aggregates 3. In the example of FIGS. 2 and 3, only one precursor gas is used, silane ($SiH_4$), to obtain a deposition of crystalline silicon nanowires 5. Other precursor gases may also be used, such as disilane or tetrafluorosilane ($SiF_4$), for the making of crystalline silicon nanowires 5.

The growth of semiconductor nanowires and nanotubes on a substrate is generally made according to the vapour-liquidsolid (VLS) mechanism, in which the metal aggregates 3 play a determining role. The vapour-solid-solid (VSS) mechanism may also be used.

According to the VLS mechanism, the metal aggregates 3 located at the surface of the metal oxide substrate 2 can, in a first time, catalyze the precursor gas dissociation.

When the growth temperature is above the eutectic point of the silicon/metal mixture, the precursor atoms diffuse into the aggregate, which becomes liquid.

When the concentration in the thus formed precursor/metal mixture droplet reaches a saturation value, the precursor atoms precipitate out.

Due to the small size of the precursor/metal mixture droplets and the importance then taken by the surface energies, this precipitation preferably takes place at an interface, generally the interface between the metal oxide substrate 2 and the precursor/metal mixture droplet.

A solid phase is then formed, which causes a columnar growth under the precursor/metal mixture droplet. The size and density of the metal aggregates 3 thus control those of the obtained nanostructures 1.

Moreover, the growth temperature of the nanostructures 1 is constrained by the eutectic point of the precursor/metal mixture.

Now, the process, by reducing metal oxides, permits the use of metals whose melting point is low (for example, 156.6° C. for indium and 231.9° C. for tin), such as a fortiori the eutectic point of the precursor/metal mixture. Thus, the growth of the nanostructures 1 can be made at a reduced temperature.

An example of process of producing silicon nanowires on an ITO substrate is illustrated hereinafter. This process has also been successfully tested on a $SnO_2$ substrate.

As shown in FIG. 2, the hydrogen feed is stopped and the precursor gas $SiH_4$ is introduced. It is possible to add a doping gas, such as phosphine ($PH_3$) or triméthylboron ($B(CH_3)_3$), to the precursor gas. No handling of the metal oxide substrate 2, opening of the reactor plasma or additional pumping is required.

The pressure of precursor gas $SiH_4$ inside the chamber of the plasma reactor 4 is maintained around 60 mTorr. Plasma is initiated, with an injected power of 2 W, and maintained during a variable time duration according to the desired length of crystalline silicon nanowires 5.

Figure 6:
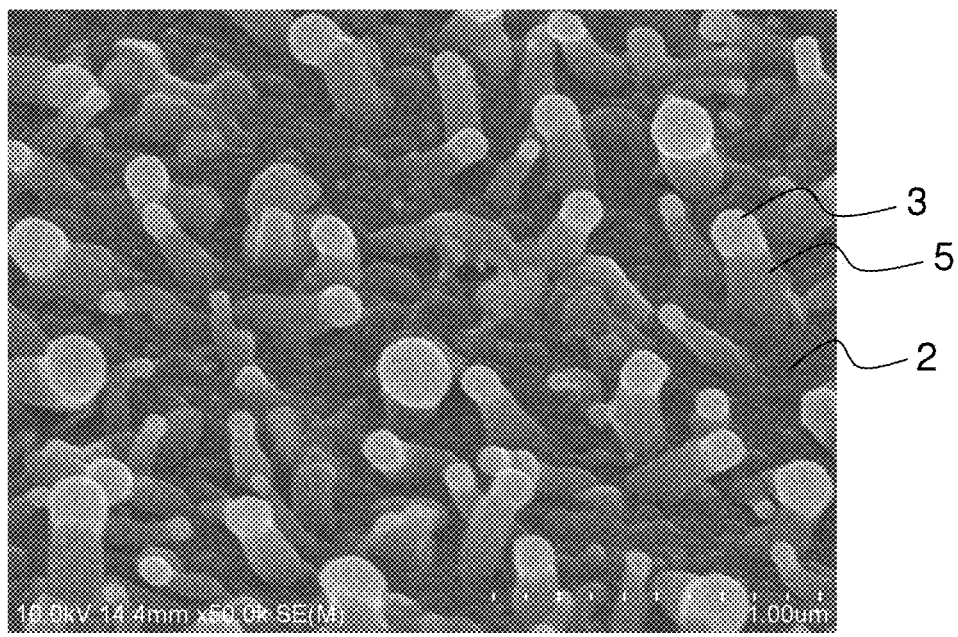
FIG. 6 illustrates an image of crystalline silicon nanowires on a metal oxide substrate, made by scanning electron microscopy.

Non doped crystalline silicon nanowires 5 obtained in those conditions with a growth time of 15 min are shown in FIG. 6. FIG. 6 illustrates an image of the crystalline silicon nanowires 5, made by scanning electron microscopy. The sample is inclined by 45° with respect to the electron beam of the scanning electron microscope.

The typical length of the crystalline silicon nanowires 5 is 300 nm, their base diameter is comprised between 50 and 200 nm. The metal aggregate droplets 3 can be seen, in clear grey, at the end of the crystalline silicon nanowires 5.

The metal oxide substrate 2 is formed of a glass substrate or other, as mentioned above, and covered with a metal oxide layer.

According to a particular embodiment of the invention, the metal oxide layer is discontinuous and comprises metal oxide patterns or bumps. Indeed, it is possible to create metal oxide patterns on the glass substrate, for example, by known methods of lithography. It is possible, by lithography, to define metal oxide patterns of small size (a few nm to a few microns), regularly spaced apart on the substrate.

Figure 7:
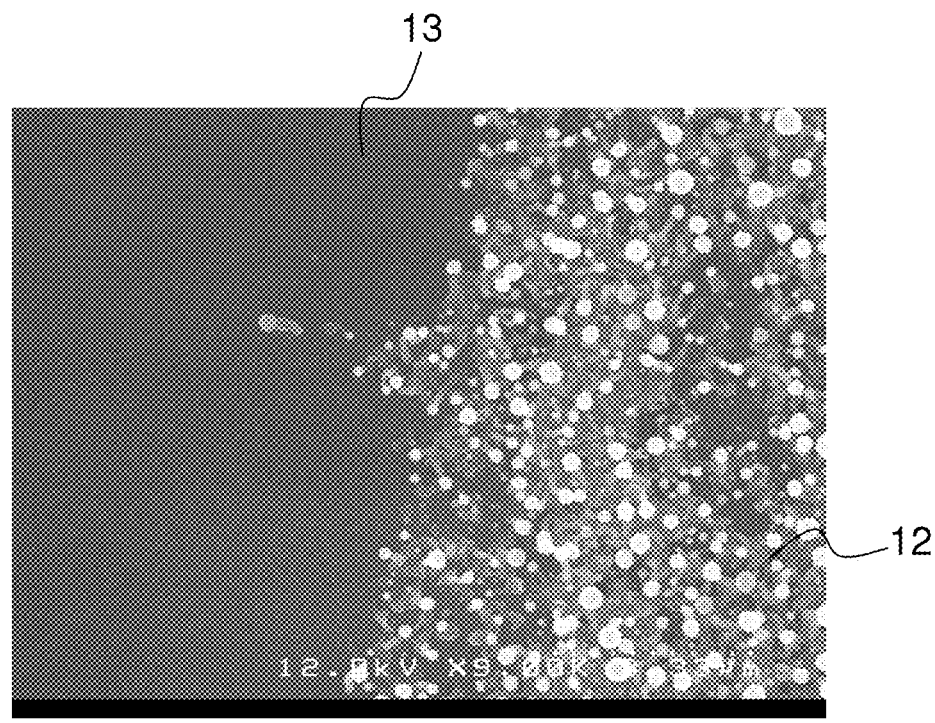
FIG. 7 illustrates an image made by scanning electron microscopy, showing a limit between an area comprising crystalline silicon nanowires and an area comprising amorphous silicon.

After the steps of a) forming metal aggregates and b) growing nanostructures according to the invention, the obtained thin-film device comprises one or several areas 12 comprising crystalline silicon nanowires and one or several areas 13 comprising amorphous silicon, for example, as illustrated in the example of FIG. 7. FIG. 7 illustrates an image, made by scanning electron microscopy, of a limit between an area comprising crystalline silicon nanowires 12 and an area comprising amorphous silicon 13.

The area 12 comprising crystalline silicon nanowires corresponds to an area of the glass substrate initially covered with ITO. This area 12 is very diffusive. As for the area 13 comprising amorphous silicon, it corresponds to an area of the glass substrate non-covered with ITO. This area 13 is more transparent than the area 12 comprising crystalline silicon nanowires. By using a metal oxide bump having a surface area of the order of one square micrometer, it is possible, with the process according to the invention, to control the growth of a single nanostructure and thus of the electronic component made afterwards. For applications in the field of electronics, it is possible to define the areas where the electronic components will be located.

Figure 8:
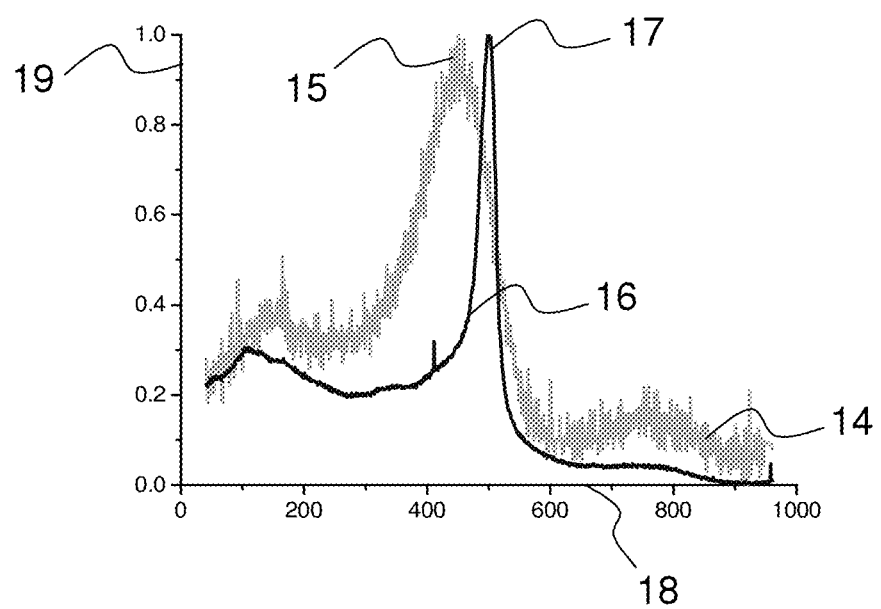
FIG. 8 illustrates two Raman spectra corresponding to the area comprising crystalline silicon nanowires and to that comprising amorphous silicon, respectively.

FIG. 8 illustrates two Raman spectra 14, 16 of the silicon deposit on the two areas 12, 13 of the sample shown in FIG. 7.

The abscissa axis 18 represents the Raman offset in $cm^{-1}$. The ordinate axis 19 represents the normalized intensity.

The Raman spectrum 14 of the area 13 comprising amorphous silicon has a wide peak 15 centred at about 480 $cm^{-1}$. The Raman spectrum 16 of the area 12 comprising crystalline silicon nanowires has a narrow peak 17 centred at about 510 $cm^{-1}$, corresponding to crystalline silicon.

The above example shows an embodiment permitting to obtain silicon nanowires.

The process of producing nanostructures on a metal oxide substrate, according to the invention, permits to grow, on a metal oxide substrate 2, nanostructures 1 of a nature (or composition) different form that of the metal oxide substrate 2.

The metal aggregate droplets 3 (made of metal) being formed from the metal oxide substrate 2, they are also of a nature different from that of the nanostructures 1.

The elements constituting the nanostructures 1 come from the precursor gas(es) injected during the step b) of growing nanostructures. The elements constituting the nanostructures 1 are non-metallic elements.

It is possible to obtain germanium, silicon, gallium or carbon-based nanostructures 1 on metal oxide substrates 2.

The process of producing nanostructures on a metal oxide substrate, according to the invention, permits to obtain, on a metal oxide substrate 2, binary semiconductor nanowires made of germanium (Ge), germanium silicide (SiGe), silicon carbide (SiC), silicon nitride (SiN), gallium arsenide (AsGa), or other compounds.

The process of producing nanostructures on a metal oxide substrate, according to the invention, can also be used for depositing carbon nanotubes on a metal oxide substrate 2. Then, the precursor gas used is methane.

The vapour phase growth of nanostructures 1 on the metal oxide substrate may be preferentially carried out by the PECVD method, as mentioned above, but also by a chemical vapour deposition (CVD) method.

The present invention also relates to a process of depositing thin-film layers on a metal oxide substrate 2, comprising the steps a) and b) of the above-defined process of producing nanostructures 1 on a metal oxide substrate 2 permitting to obtain a metal oxide substrate 2 covered with crystalline silicon nanowires 5.

The gases present, the deposition conditions, temperature, pressure, and the power injected into the plasma, may be modified afterwards for the deposition of other thin-film layers of materials on the nanostructures 1, without having to take them out in the air.

Figure 4:
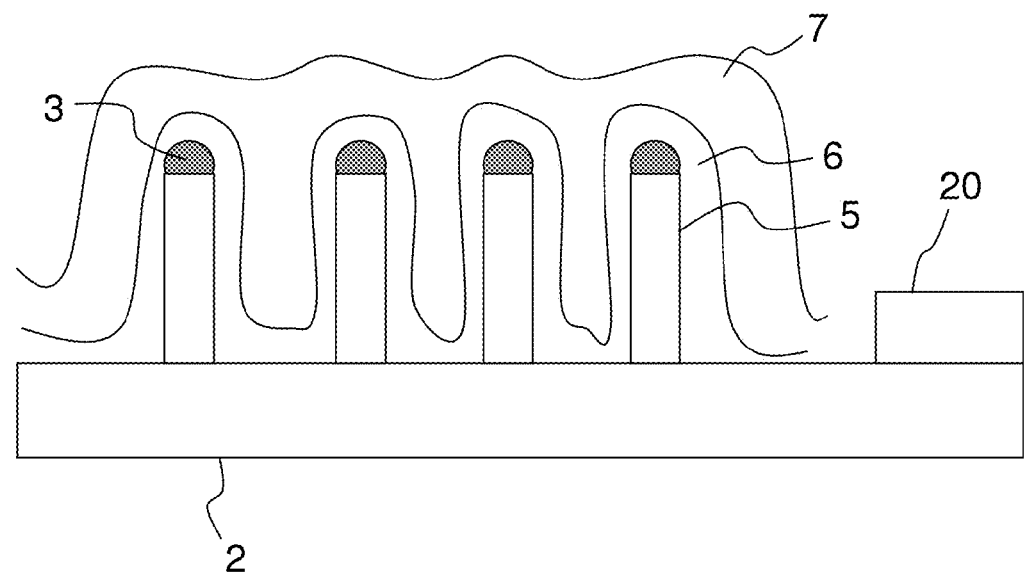
FIG. 4 illustrates a thin-film device, according to an embodiment of the invention.

For example, by reducing the temperature of the metal oxide substrate 2, it is possible to deposit an amorphous or polycrystalline element thin-film layer 6 conforming to the morphology of the nanostructures 1, as shown in FIG. 4.

The same precursor gas than that which is used in the step b) of vapour phase growing nanostructures 1 on the metal oxide substrate 2 is injected in the plasma reactor 4, so as to permit the covering of the crystalline silicon nanowires 5 by an amorphous or polycrystalline element thin-film layer 6 made of the same chemical element than that of the crystalline silicon nanowires 5, for example silicon.

When the chemical element is silicon, the temperature of the metal oxide substrate 2 can be controlled to about 200° C.

In another possible embodiment, the gaseous precursor used in the step b) of vapour phase growing nanostructures 1 can be injected into the plasma reactor 4, diluted in a gas causing etching reactions. This dilution gas can be hydrogen, for example. The plasma is then generated. The amorphous element being etched more easily than the crystalline element, this method permits to reduce the thickness of the amorphous element layer deposited during the growth of the nanostructures 1, around the crystalline silicon nanowires 5. The amorphous element deposition by the PECVD method, outside the metal aggregates 3, is limited. This dilution in an etching gas permits to favour the growth of the crystalline silicon nanowires 5 on the metal aggregates 3 with respect to the parasitic amorphous element deposition.

The process of depositing thin-film layers on the metal oxide substrate 2 can also comprise, after the step of depositing the amorphous or polycrystalline element thin-film layer 6, a step of depositing a polycrystalline or amorphous element thin-film layer 7 or a semiconductor organic thin-film layer.

The polycrystalline element thin-film layer 7 may be an inorganic thin-film layer made of the same chemical element than that of the crystalline silicon nanowires 5 and of the amorphous or polycrystalline element thin-film layer 6. It is possible to form, for example, a photovoltaic cell made of thin-film silicon layers.

The crystalline silicon nanowires 5 may serve as a germ for the growth of the polycrystalline silicon.

The polycrystalline element thin-film layer 7 may also be an inorganic thin-film layer made of a different chemical element or of the same chemical element doped.

By using a semiconductor organic thin-film layer, it is possible to form a hybrid photovoltaic cell.

The very diffusive layer formed by the silicon nanowires permits to increase the length of the optical path of the incident light, and thus, for a same given thickness, to improve the ray absorption.

A thin-film device is obtained, as shown in FIG. 4, which comprises a metal oxide substrate 2 covered with crystalline silicon nanowires 5, one amorphous or polycrystalline element thin-film layer 6 covering the crystalline silicon nanowires 5, and another polycrystalline or amorphous element thin-film layer 7, or one semiconductor organic thin-film layer, covering the amorphous or polycrystalline element thin-film layer 6.

The samples obtained after the steps a) and b) of the process of producing nanostructures 1 can thus be completed in situ in the same plasma reactor 4, by other thin-film layers so as to form semiconductor device, such as, for example, a p-i-n or n-i-p photovoltaic cell.

This thin-film device also comprises a contact 20 connected to the metal oxide substrate 2. The nanostructures 1 can also be used as a texture for the electrode.

The different steps described above are carried out in series in the same plasma reactor 4.

The above-described process of producing nanostructures 1 on a metal oxide substrate 2 uses a radiofrequency (RF) plasma, but this process is not limited to this single type of plasma.

As the plasma treatments can be applied to large samples (there exists reactors that permit to deposit amorphous silicon on substrates of 5 m$^2$), this process permits to rapidly obtain mats of nanostructures 1 on large surface areas.

The process, according to the invention, permits to eliminate a step in the growth of nanostructures 1 on a substrate, i.e. the step of depositing and positioning aggregates of a metal catalyst. Consequently, the complete growth process is shorter, better controlled (absence of pollution) and requires reduced equipment (for example, the use of an evaporator is avoided).

The process, according to the invention, permits, by the use of plasmas (acting on the precursor gas molecule dissociation) and metals, coming from the metal oxides, of low melting point, to substantially reduce the temperature during the treatment (less than 300° C., compared to more that 450° C. with gold as a catalyst in the prior art processes). This enlarges the range of potentially usable substrates (the metal oxides may be deposited as thin-film layers on many types of support), and induces reduced fabrication costs.

This process permits to have a perfect cohesivity between the nanostructures 1 and the metal oxide substrate 2 (because they grow directly from the latter). The metal oxide substrate 2 has itself electric and optical properties that can be used in thin-film devices.

The invention claimed is:

1. A process of producing nanostructures (1) on a metal oxide substrate (2), comprising the steps of:
    a) forming metal aggregates (3) on said metal oxide substrate (2),
    b) vapour phase growing nanostructures (1) on said metal oxide substrate (2) covered with metal aggregates (3), said substrate being heated in the presence of one or more precursor gases, and the vapour phase growth of nanostructures (1) being catalyzed by the metal aggregates (3),
    wherein:
    the step a) of forming metal aggregates comprises an operation of reducing the surface of the metal oxide substrate by means of reducing plasma treatment, causing the formation of metal aggregate droplets (3) on the surface of said metal oxide substrate (2), and
    said steps of a) forming metal aggregates and b) growing nanostructures are carried out in series in a single and same plasma reactor chamber (4), the nanostructure growth, by CVD or PECVD, being made directly on the metal aggregate droplets (3).

2. The process of producing nanostructures (1) on a metal oxide substrate (2) according to claim 1, wherein, during said steps of a) forming metal aggregates and b) growing nanostructures, the metal oxide substrate (2) is heated to a temperature higher than or equal to the melting point of the metal composing the metal oxide (2).

3. The process of producing nanostructures (1) on a metal oxide substrate (2) according to claim 1, wherein the metal oxide substrate (2) is composed of the oxide of a metal having a melting point lower than or equal to 300° C.

4. The process of producing nanostructures (1) on a metal oxide substrate (2) according to claim 1, wherein the metal oxide is selected from the group consisting of $SnO_2$, ZnO, ITO and $In_2O_3$.

5. The process of producing nanostructures (1) on a metal oxide substrate (2) according to claim 1, wherein, the metal oxide substrate (2) being formed of a substrate covered with a metal oxide layer, said metal oxide layer is discontinuous and comprises metal oxide patterns.

6. The process of producing nanostructures (1) on a metal oxide substrate (2) according to claim 1, wherein the nanostructures (1) are selected from the group consisting of Si, Ge, SiGe, SiC, C and SiN.

7. The process of producing nanostructures (1) on a metal oxide substrate (2) according to claim 1, wherein, the plasma reactor (4) being a plasma-enhanced chemical vapour deposition (PECVD) reactor, the precursor gas used in the step b) of vapour phase growing the nanostructure (1) is diluted in a dilution gas, said dilution gas limiting, by etching, the deposition of amorphous elements outside the metal aggregates (3).

8. The process of producing nanostructures (1) on a metal oxide substrate (2) according to claim 7, wherein the dilution gas is dihydrogen ($H_2$).

9. The process of producing nanostructures (1) on a metal oxide substrate (2) according to claim 1, wherein the reducing plasma is hydrogen plasma, wherein the process of hydrogen plasma treatment comprises the steps of:
- injecting gaseous hydrogen ($H_2$) in the chamber of the plasma reactor (4), and
- generating a plasma in the chamber of the plasma reactor (4) during a time duration t, the diameter of the metal aggregate droplets (3) depending, among other things, on said time duration t.

10. The process of producing nanostructures (1) on a metal oxide substrate (2) according to claim 1, wherein the plasma reactor (4) is a radiofrequency plasma-enhanced chemical vapour deposition (PECVD-RF) reactor, wherein, during the operation of hydrogen plasma treatment:
- the pressure of hydrogen in the chamber of the plasma reactor (4) is comprised between 180 mTorr and 1000 mTorr, corresponding to a time duration t of plasma generation in the chamber of the plasma reactor (4) of about 3 min,
- the radiofrequency power density used to generate the plasma is comprised between 10 and 1000 $mW/cm^2$.

11. A process of depositing thin-film layers on a metal oxide substrate (2), comprising:
- the steps a) and b) of the process of producing nanostructures (1) on a metal oxide substrate (2) as defined according to claim 1, wherein a precursor gas is injected into the plasma reactor (4), so as to obtain a metal oxide substrate (2) covered with crystalline elements nanowires (5),
- a step of depositing an amorphous or polycrystalline element thin-film layer, during which the temperature of the metal oxide substrate (2) is controlled around 200° C., wherein the same precursor gas is injected into said plasma reactor (4), so as to permit the covering of the crystalline element nanowires (5) with an amorphous or polycrystalline element thin-film layer (6).

12. The process of depositing thin-film layers on a metal oxide substrate (2) according to claim 11, further comprising, after the step of depositing the amorphous or polycrystalline element thin-film layer (6), another step of depositing an amorphous or polycrystalline element thin-film layer (7) or a semiconductor organic thin-film layer.

13. A thin-film device, wherein said thin film device has been obtained by the process as defined according to claim 11, said thin-film device comprising:
- a metal oxide substrate (2) covered with crystalline element nanowires (5), and
- an amorphous or polycrystalline element thin-film layer (6) covering said crystalline element nanowires (5).

14. The thin-film device according to claim 13, further comprising an amorphous or polycrystalline element thin-film layer (7), or a semiconductor organic thin-film layer, covering said amorphous or polycrystalline element thin-film layer (6).

* * * * *